May 30, 1961 R. F. RUTZ 2,986,653
NON-COMMUTATIVE LOGICAL CIRCUITS
Original Filed May 20, 1955
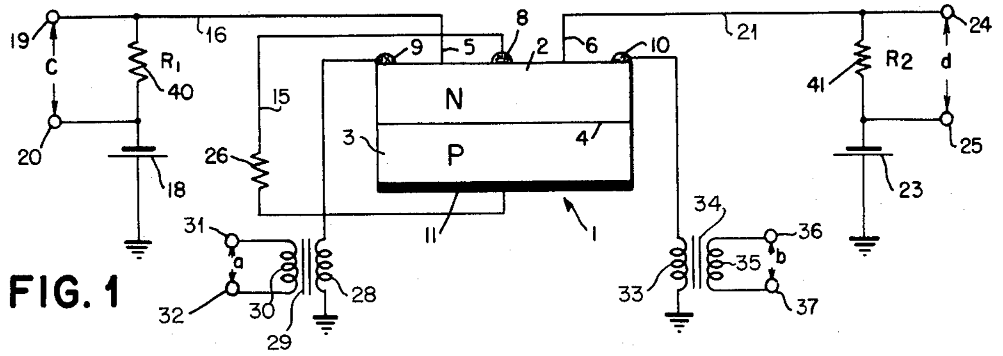
FIG. 1
FIG. 2
| a | b | c | d |
|---|---|---|---|
| 0 | 0 | OFF | OFF |
| 1 | 0 | OFF | ON |
| 0 | 1 | ON | OFF |
| 1 | 1 | OFF | OFF |
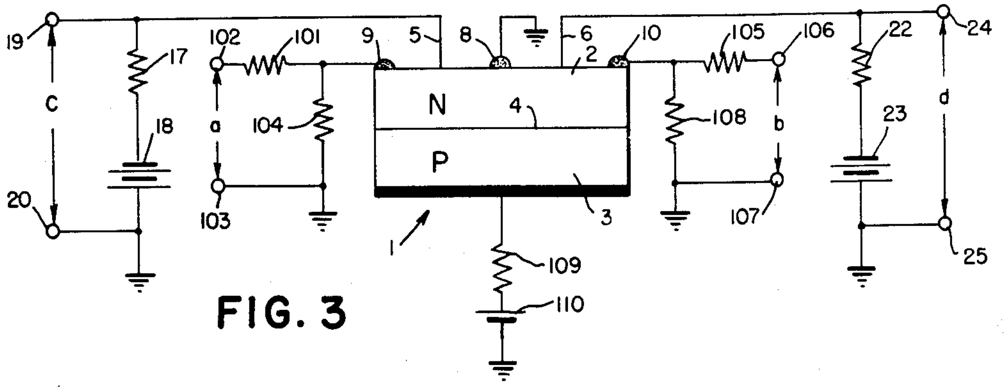
FIG. 3
FIG. 4
| a | b | c | d |
|---|---|---|---|
| 0 | 0 | ON | OFF |
| 1 | 0 | OFF | ON |
| 0 | 1 | ON | OFF |
| 1 | 1 | ON | OFF |
FIG. 5
| a | b | c | d |
|---|---|---|---|
| 0 | 0 | ON | OFF |
| 1 | 0 | OFF | ON |
| 0 | 1 | ON | OFF |
| 1 | 1 | OFF | OFF |
INVENTOR
RICHARD F. RUTZ
BY Lester H. Clark
ATTORNEY United States Patent Office 2,986,653

Patented May 30, 1961

2,986,653

NON-COMMUTATIVE LOGICAL CIRCUITS

Richard F. Rutz, Fishkill, N.Y., assignor to International Business Machines Corporation, New York, N.Y., a corporation of New York Original application May 20, 1955, Ser. No. 509,852. Divided and this application Jan. 31, 1958, Ser. No. 712,383

3 Claims. (Cl. 307—88.5)

This is a division of my copending application Serial No. 509,852, filed May 20, 1955, entitled "Multiple Collector Transistors and Circuits Therefor" which is in turn a continuation in part of my application Serial No. 358,-619, filed September 27, 1954, now U.S. Patent No. 2,889,499, entitled "Transistor Circuit Element."

There are shown and described in said application Serial No. 458,619, transistors comprising a body of semi-conductive material including two thin regions of substantially equal area and of opposite conductivity types, the two regions being separated by a boundary junction. One of the two regions has a thickness substantially no greater than the diffusion length for the average lifetime of minority carriers in the material of that region. The second region has a resistivity substantially lower than (e.g., approximately equal to one-tenth) that of the first region and is sufficiently thin so that when provided with an ohmic electrical connection over most of its area, there is substantially no potential gradient throughout it. A high alpha collector is connected to the first-mentioned zone at the surface thereof on the opposite side from the junction. The junction, or part of it, serves as an emitter for minority carriers traveling toward the collector. The flow of minority carriers from the junction is controlled by an electric field impressed across the higher resistivity region and effective to produce a potential gradient therein which determines how great a proportion of the junction is forwardly biased so as to emit minority carriers.

In accordance with the invention claimed in my application Serial No. 509,852, the transistors of my earlier application may be modified by the addition of a second collector on the same side of the high resistivity region as the first collector. The distribution of current flow between the two collectors is determined by an electric field impressed across the region of higher resistivity.

The present invention concerns non-commutative logical circuits utilizing transistors of the type described.

An object of the present invention is to provide improved non-commutative logical circuits employing transistors of the type described.

The foregoing object is attained in the circuits described herein by providing a transistor comprising a body of semi-conductive material including two regions of substantially equal area and opposite conductivity types separated by a boundary junction. A first one of the regions has a resistivity substantially higher than the other and a thickness substantially no greater than the diffusion length for the average lifetime of minority carriers in the material of that region. Two collectors are in electrical contact with that first region on the surface thereof opposite the junction, and are spaced apart by a distance substantially greater than the diffusion length. The boundary junction serves as an emitter for the two collectors. The low resistivity region operates substantially at a fixed potential throughout its area. One of the two collectors is biased ON. The emission of minority carriers from the junction and hence the ON and OFF conditions of the two collectors is controlled by signal inputs connected to the opposite ends of the high resistivity region and effective to control the potential gradient across that region, thereby determining the polarity and magnitude of the bias across the respective portions of the junction opposite the respective collectors. Signal outputs are connected to the respective collectors.

Other objects and advantages of the invention will become apparent from a consideration of the following specification and claims taken together with the accompanying drawings.

In the drawings:

Fig. 1 is an electrical wiring diagram of a non-commutative logical circuit embodying the invention;

Fig. 2 is a table illustrating the various logical signal input and output conditions in the circuit of Fig. 1;

Fig. 3 is a wiring diagram of a modified non-commutative logical circuit embodying the invention; and Figs. 4 and 5 are tables similar to Fig. 2, illustrating two different modes of operation of the circuit of Fig. 3.

*Figs. 1 and 2*

There is shown in Fig. 1 a transistor generally indicated by the reference numeral 1 and including a semi-conductive body comprising a region 2 of N type semi-conductive material and a region 3 of P type semi-conductive material. These regions are separated by a boundary junction 4. Two collectors 5 and 6 engage the surface of the N region 2 opposite the junction 4. The collectors 5 and 6 are separated by a distance which is greater than the diffusion length for the average lifetime of minority carriers in the N region 2. The thickness of the N region 2 between the surface engaged by the collectors 5 and 6 and the junction 4 must be substantially equal to or less than that diffusion length.

The resistivity of N region 2 should be sufficiently greater than that of P region 3 to ensure efficient emission of minority carriers from junction 4. For example, a resistivity of N region 2 equal to ten times the resistivity of P region 3 is considered suitable for the modification described herein, unless otherwise specified. More specifically, a resistivity of 5 ohm-cm. may be used for region 2 and a resistivity of 0.5 ohm-cm. for region 3.

It will be readily understood that the order of the types of the semi-conductive materials may be reversed, i.e. region 2 may be made P type and region 3 N type. If so reversed, the same dimensional and resistivity limitations apply as described above. That is to say, the diffusion length of minority carriers in region 2 always determines the dimensional limitations and region 2 always has a greater resistivity than region 3.

The collectors 5 and 6 may be electro-formed point contacts, or may be any other collector structure having an intrinsic current amplification greater than 1 and (for N type material) preferably greater than $1+b$, where $b$=the mobility ratio of electrons and holes in the region 2. For P type material, the intrinsic current amplification is preferably greater than $1+1/b$.

An ohmic electrical connection 8 is made to the upper surface of the N region 2 between the collectors 5 and 6 and additional ohmic connections 9 and 10 are made to the upper surface of N region 2 at its opposite ends. A broad ohmic electrical connection 11 extends over substantially the entire lower surface of the P region 3. The resistivity of region 3 is low enough and that region is made thin enough so that, with the aid of the broad connection 11, the P region is operated as an equipotential region. Collector 5 is connected through a wire 16, a load resistor 40 and a load supply battery 18 to ground. Output terminals 19 and 20 are respectively connected to the collector 5 and to the negative terminal of battery 18.

Collector 6 is connected through a wire 21, a load resistor 41 and a load supply battery 23 to ground. Output terminals 24 and 25 are respectively connected to the collector 6 and to the negative terminal of battery 23.

The ohmic connection 9 is connected to ground through the secondary winding 28 of an input transformer 29. The primary winding 30 of input transformer 29 is connected to input terminals 31 and 32, one of which is grounded.

Ohmic connection 10 is similarly connected to the secondary winding 33 of an input transformer 34 having a primary winding 35. One terminal of each of the windings 32 and 35 is grounded. Primary winding 35 is connected to input terminals 36 and 37.

It will be recognized that in the construction of a transistor such as transistor 1, the collectors 5 and 6 will not have exactly equal impedance and their locations will not be exactly equal with respect to their spacing from the ohmic connection 8 and from the junction 4. Because of such inequalities minority carries omitted from the junction 4 normally tend to diffuse more readily to one of the collectors than to the other. Such an unbalance of the collectors may be readily introduced intentionally in the manufacture of the transistor, by a number of different expedients, such as positioning the ohmic connection 8 closer to one collector than to the other.

*Operation of Fig. 1*

Assume that the signals received at input terminals 30, 31 and 36, 37 are of magnitudes and polarities such that an even potential gradient is thus established across the N region 2 with the right-hand end positive. The central portion of the N region which is at a median potential is connected through a wire 15 and a resistor 26 to the P region 3, so that the entire P region is substantially at that median potential. The right-hand half of the junction 4 is then reversely biased, since the P region 3 is at a less positive potential than the potential above the junction 4. On the other hand, the left-hand half of the junction 4 is forwardly biased, since the N region 2 above it is at a less positive potential than the P region 3 below it. The left-hand half of the junction may therefore serve as an emitter of holes into the N region 2. These holes are collected at the collector 5 and a large output current pulse is produced, appearing as a signal at the output terminals 19 and 20.

When current starts flowing through collector 5, the potential gradient produced by the current in N region 2 may tend to increase the forward potential across the left-hand portion of junction 4, thereby increasing the supply of holes. The resistor 26 effectively limits the hole supply, preventing the action from being cumulative beyond a definite point, and improving the switching speed.

If for any reason it is desired not to limit this cumulative action in any particular instance, resistor 26 may be omitted.

After the positive input signal terminates, both terminals 9 and 10 are at ground potential, and the potential difference across the junction 4 becomes very small. If the junction 4 continues to emit holes, that emission is accompanied by a potential drop across resistor 26, so that region 3 becomes momentarily negative with respect to region 2, junction 4 becomes reversely biased, and the emission stops, turning the transistor OFF.

Now assume that the signals received at input terminals 30, 31 and 36, 37 are of opposite polarities, such that a potential gradient is established across N region 2 with the left-hand end positive. The operation is analogous to that just described, except that the right-hand half of the junction 4 is forwardly biased and the left-hand half is reversely biased so that a substantial output current flows through collector 6 and an output signal appears at terminals 24 and 25.

The circuit illustrated in Fig. 1 is a non-commutative logical circuit. The relative values of the load resistors

40 and 41 are selected so that collector 5 or 6, whichever has the greater intrinsic current amplification, normally operates in the saturation region. The normal condition of the output terminals 19 and 20 is their OFF or non-signal producing condition.

The input signals at terminals 31 and 32 are indicated in the table of Fig. 2 in the column under the reference character *a*. The input signals at terminals 36 and 37 are indicated in the column under the reference character *b*. Output signals at terminals 19 and 20 are indicated in the column under the reference character *c*, and output signals at the terminals 24 and 25 are indicated in the column under the reference character *d*.

The table of Fig. 2 shows the various combinations of input signals *a* and *b* and the resulting combinations of output signals *c* and *d*. It may be seen that there are only two combinations of signals at input terminals *a* and *b* which can shift the output signals from their normal condition with the signal *c* off and the signal *d* off. These particular combinations of input signals are with the signal *a* at its binary 1 value (positive) and the signal *b* at its binary 0 value, and the converse.

A binary 1 input signal may correspond, for example, to an input potential of +5 volts, while a binary 0 corresponds to an input potential of 0 volts. When the input signals are in the conditions illustrated in the second line of the table, the connection 9 is substantially at +5 volts and the connection 10 is at ground potential. The left-hand half of the junction 4 is then reverse biased, and collector 5 is OFF. If both of these two signal potentials shift from these values to the opposite values, as in line 3 of Fig. 6, then the collector 5 is turned ON. As long as both input signals are the same at any value, then they counteract each other and do not disturb the normal condition of the output signals.

It may therefore be seen that the circuit of Fig. 1 operates as a non-commutative logical circuit, in that only one of the possible combinations of input signals will operate to shift a given collector from its normal output condition to a different output condition. The circuit therefore logically distinguishes that one particular combination of input signals from all other possible combinations.

*Figs. 3 to 5*

Fig. 3 illustrates a non-commutative logical circuit using the same transistor 1 as the circuit of Fig. 1, but operating in a somewhat different manner. The input signals are resistively coupled to the transistor in the circuit of Fig. 3 instead of being transformer coupled as in the circuit of Fig. 1. Furthermore, the junction 4 is permanently biased forwardly. Those circuit elements of Fig. 3 which are the same as those in Fig. 1 have been given the same reference numerals and will not be further described. Load resistors 40 and 41 of Fig. 1, which may be unequal, are replaced by equal load resistors 17 and 22.

Ohmic connection 9 is connected through a resistor 101 to an input terminal 102. Another input terminal 103 is grounded. Connection 9 is also connected through a resistor 104 to ground. Ohmic connection 10 is connected through a resistor 105 to an input terminal 106. Cooperating input terminal 107 is grounded. Connection 10 is also connected through a resistor 108 to ground. Ohmic connection 11 is connected through a resistor 109 and a biasing battery 110 to ground. Ohmic connection 8 is directly connected to ground.

*Operation of Fig. 3*

As in the case of the circuit Fig. 1, it is assumed that a binary 1 input signal corresponds to an input potential of +5 volts and that a binary 0 input signal corresponds to an input potential of 0 volts. It is essential that the transistor 1 be constructed so that one of the collectors is favored over the other. Since the junction 4 is biased forwardly by battery 110, then if there is no input signal at either of the sets of input terminals 102, 103 or 106, 107, the favored collector conducts, and sets up a potential gradient in the N region 2 which effectively reduces the number of holes reaching the other collector.

The table of Fig. 4 shows the state of the transistor 1 for various combinations of input signals, when the signal value of the input potential has a small value, for example, 5 volts. When there is no input signal at either set of input terminals, as shown in line 1 of Fig. 4, collector 5 is conducting and an output signal appears at terminals 19 and 20. Collector 6 is not conducting and no output signal appears at terminals 24 and 25. If, as in line 2 of Fig. 4, a positive signal is now received at input terminal 102, it becomes effective to reverse bias the portion of the junction 4 opposite to collector 5, thereby cutting off that collector, so that the holes emitted by junction 4 flow to collector 6, producing a signal at output terminals 24 and 25.

The combination of input signals in line 3 of Fig. 4 restores the normal condition of the output terminals. The collector 5 remains ON, and a positive input signal at terminal 106 tends to hold collector 6 OFF even more strongly.

When the input conditions are as indicated in the fourth line of Fig. 4, the two input signals balance one another and the conditions at the output terminals are again in their normal state as they would be if there were no input signals.

If an input signal of somewhat larger potential is used, for example 10 volts, then the table of Fig. 5 may apply instead of the table of Fig. 4. The two tables are identical except for their last line, when input signals are received at both sets of input terminals. If the input signal is sufficiently strong as compared to the biasing potential of battery 110, then that input signal may be effective to turn the collector 5 OFF, so that both collectors remain OFF at the same time.

Either the arrangement of Fig. 4 or the arrangement of Fig. 5 may be used as a non-commutative logical circuit. The arrangement of Fig. 4 is to be preferred, since it provides complementary outputs, either of which distinguishes one particular combination of input signals from all other possible combinations of input signals.

While I have shown and described certain preferred embodiments of my invention, other modifications thereof will readily occur to those skilled in the art and I therefore intend my invention to be limited only by the appended claims.

I claim:

1. A non-commutative logical circuit including a transistor comprising a body of semiconductive material including two thin regions of substantially equal area and of opposite conductivity types, separated by a boundary junction, one of said regions having a thickness substantially no greater than the diffusion length for the average lifetime of minority carriers in the material thereof, the other of said regions having a resistivity substantially lower than said one region, two collectors having high intrinsic current amplification in electrical contact with said one region on the side thereof opposite said junction, said collectors being spaced by a distance substantially greater than said diffusion length, a pair of signal output means connected respectively to said two collectors, circuit means connected to said other region for supplying current thereto, a pair of signal input means connected to the opposite ends of said one region for controlling the potential gradient thereacross, each signal input means being shiftable independently of the other signal input means between separated signal and no-signal potentials, said circuit means and the pair of signal input means cooperating to determine the polarity and magnitude of the bias potentials across the portions of the junction opposite the respective collectors, means connected to the collectors for supplying direct electrical energy thereto and effective when both signal input means are at their no-signal potentials to hold one of the collectors in a first stable state of conductivity, said pair of signal input means being cooperating with said transistor body and said circuit means in only one other combination of input signals to shift said one collector to a different stable state of conductivity.

2. A non-commutative logical circuit as defined in claim 1, in which the current supply means includes means biasing the junction forwardly to emit minority carriers therefrom toward the collectors, and including means in the transistor favoring the transmission of minority carriers from the junction to one of the collectors.

3. A non-commutative logical circuit as defined in claim 1, in which the signals at the pair of signal output means are complementary.

References Cited in the file of this patent

UNITED STATES PATENTS

| | | |
|---|---|---|
| 2,595,496 | Webster | May 6, 1952 |
| 2,641,717 | Toth | June 9, 1953 |
| 2,790,034 | McAffee | Apr. 23, 1957 |
| 2,795,744 | Kircher | June 11, 1957 |
| 2,801,348 | Pankove | July 30, 1957 |
| 2,854,588 | Landauer | Sept. 30, 1958 |

UNITED STATES PATENT OIFICE

CERTIFICATE OF CORRICTION

Patent No. 2,986,653 May 30, 1961

Richard F. Rutz

It is hereby certified that error appears in te above numbered patent requiring correction and that the said Letters 'atent should read as corrected below.

Column 1, lines 18 and 19, for "358,61'" read -- 458,619 --; column 6, line 25, for "effectve" read -- cooperating with said transistor body and said drcuit means --; lines 28 and 29, for "cooperating with said transistor body and said circuit means" read -- effective --.

Signed and sealed this 24th day of Otober 1961.

(SEAL)
Attest:

ERNEST W. SWIDER
Attesting Officer

DAVID L. LADD
Commissioner of Patents

USCOMM-DC